United States Patent [19]
Pan

[11] Patent Number: 5,858,832
[45] Date of Patent: Jan. 12, 1999

[54] METHOD FOR FORMING A HIGH AREAL CAPACITANCE PLANAR CAPACITOR

[75] Inventor: Yang Pan, Singapore, Singapore

[73] Assignee: Chartered Semiconduction Manufacturing Ltd., Singapore, Singapore

[21] Appl. No.: 613,653

[22] Filed: Mar. 11, 1996

[51] Int. Cl.$^6$ .............................................. H01L 21/8242
[52] U.S. Cl. .......................................... 438/230; 438/253
[58] Field of Search ..................... 438/238, 239, 438/250, 253, 254, 381, 393, 396, 397

[56] References Cited

U.S. PATENT DOCUMENTS

| | | | |
|---|---|---|---|
| 4,700,457 | 10/1987 | Matsukawa | 437/52 |
| 4,985,718 | 1/1991 | Ishijima | 357/23.6 |
| 4,990,463 | 2/1991 | Mori | 437/52 |
| 5,006,481 | 4/1991 | Chan et al. | 437/52 |
| 5,262,354 | 11/1993 | Cote et al. | 437/195 |
| 5,312,512 | 5/1994 | Allman et al. | 156/636 |

*Primary Examiner*—Joni Chang
*Attorney, Agent, or Firm*—George O. Saile; Stephen B. Ackerman; Alek P. Szecsy

[57] ABSTRACT

A method for forming within an integrated circuit a high areal capacitance planar capacitor, and the high areal capacitance planar capacitor which results from the method. There is first formed upon a semiconductor substrate a first planar capacitor electrode. The first planar capacitor electrode has a first planar capacitor dielectric layer formed thereupon, and the first planar capacitor dielectric layer has a second planar capacitor electrode formed thereupon. Formed then upon the semiconductor substrate is a Pre-Metal Dielectric (PMD) layer which is planarized until the surface of the second planar capacitor electrode is fully exposed. There is formed upon the second planar capacitor electrode a second planar capacitor dielectric layer. Finally, there is formed upon the second planar capacitor dielectric layer a third planar capacitor electrode. The high areal capacitance areal capacitor may be formed within the integrated circuit without masking steps beyond those which are routinely employed in forming the integrated circuit.

15 Claims, 3 Drawing Sheets

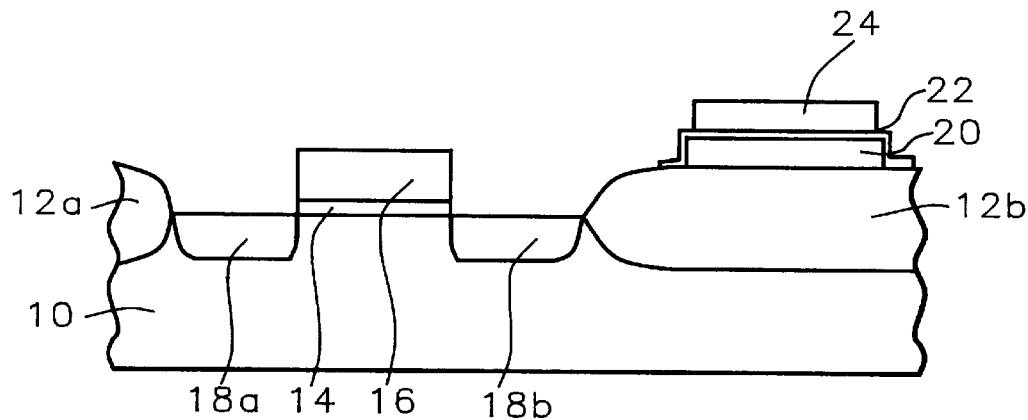
FIG. 1 – Prior Art
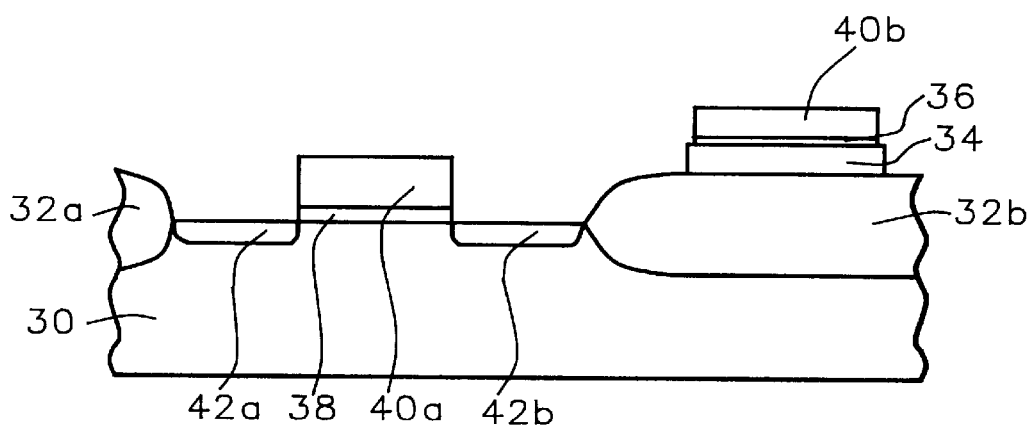
FIG. 2

METHOD FOR FORMING A HIGH AREAL CAPACITANCE PLANAR CAPACITOR

BACKGROUND OF THE INVENTION

1. Field of the Invention

The present invention relates generally to planar capacitors within integrated circuits. More particularly, the present invention relates to high areal capacitance planar capacitors within integrated circuits.

2. Description of the Related Art

In addition to resistors, transistors and diodes, integrated circuits also often have formed within their fabrications capacitors. When formed within analog integrated circuits, capacitors typically provide for proper operation of those analog integrated circuits. When formed within digital integrated circuits, capacitors typically provide charge storage locations for individual bits of digital data.

Capacitors of varying dimensions and shapes may be formed within several locations within analog or digital integrated circuits. A particularly common type of capacitor formed typically, although not exclusively, within analog integrated circuits is a planar capacitor. A schematic cross-sectional diagram illustrating an integrated circuit having a planar capacitor formed therein is shown in FIG. 1.

Shown in FIG. 1 is a semiconductor substrate 10 upon and within whose surface is formed isolation regions 12a and 12b which define the active region of the semiconductor substrate 10. Within the active region of the semiconductor substrate 10 is formed a Metal Oxide Semiconductor Field Effect Transistor (MOSFET) comprising a gate electrode 16 aligned upon a gate oxide layer 14, and a pair of source/drain electrodes 18a and 18b formed within the exposed portion of the active region of the semiconductor substrate 10 not occupied by the gate oxide layer 14 and the gate electrode 16.

As also shown in FIG. 1, the planar capacitor within the integrated circuit comprises a first planar capacitor electrode 20 separated from a second planar capacitor electrode 24 by a planar capacitor dielectric layer 22. As illustrated by FIG. 1, the planar capacitor is formed upon the surface of an isolation region of the semiconductor substrate 10, as is typical in the art. The isolation region upon which is formed the planar capacitor is the isolation region 12b.

Although the planar capacitor as illustrated in FIG. 1 is a common and accepted fabrication of a planar capacitor within an integrated circuit, the planar capacitor as illustrated in FIG. 1 is not without problems. In particular, as integrated circuit device dimensions have continued to decrease, it has become increasingly difficult to fabricate planar capacitors, such as the planar capacitor within the integrated circuit illustrated by FIG. 1, with adequate levels of capacitance within the decreasing levels of surface area afforded to those planar capacitors within advanced integrated circuits. Planar capacitors with increasing levels of areal capacitance are thus typically needed to yield planar capacitors of adequate capacitance for proper operation of advanced integrated circuits.

It is thus towards the goal of forming high areal capacitance planar capacitors within integrated circuits having limited surface area available for those planar capacitors, that the present invention is directed.

SUMMARY OF THE INVENTION

A first object of the present invention is to provide a method for forming within an integrated circuit a high areal capacitance planar capacitor.

A second object of the present invention is to provide a method in accord with the first object of the present invention, which method is also manufacturable.

In accord with the objects of the present invention there is provided a method for forming a high areal capacitance planar capacitor within an integrated circuit, as well as the high areal capacitance planar capacitor which results from the method. To form the high areal capacitance planar capacitor of the present invention, there is first provided a semiconductor substrate. Formed upon the semiconductor substrate is a first planar capacitor electrode, and formed upon the first planar capacitor electrode is a first planar capacitor dielectric layer. Formed then upon the first planar capacitor dielectric layer is a second planar capacitor electrode, and formed upon the second planar capacitor electrode is a second planar capacitor dielectric layer. Finally, there is formed upon the second planar capacitor dielectric layer a third planar capacitor electrode.

The present invention provides a method for forming within an integrated circuit a high areal capacitance planar capacitor. Through the method of the present invention there is provided a planar capacitor which has a second planar capacitor electrode which is: (1) separated from a first planar capacitor electrode by a first planar capacitor dielectric layer, and (2) separated from a third planar capacitor electrode by a second planar capacitor dielectric layer. The planar capacitor formed through the method of the present invention thus has approximately twice the capacitance of a conventional planar capacitor of equivalent areal dimension, since the planar capacitor of the present invention has a second planar capacitor electrode which serves as a common electrode within two adjoining planar capacitors occupying a surface area equivalent to the surface area occupied by a conventional planar capacitor.

The high areal capacitance planar capacitor of the present invention is readily manufacturable. The high areal capacitance planar capacitor of the present invention comprises a novel five layer capacitor structure which is formed through methods and materials which are otherwise conventional in the art of integrated circuit fabrication. To the extent that no new methods and materials are needed to form the high areal capacitance planar capacitor of the present invention, the high areal capacitance planar capacitor of the present invention is readily manufacturable.

In addition, if the five layers within the five layer capacitor structure of the high areal capacitance planar capacitor of the present invention are formed simultaneously with other patterned layers which would otherwise be formed within the integrated circuit within which is formed the high areal capacitance planar capacitor of the present invention, then significant manufacturing economy and efficiency is realized in forming the high areal capacitance planar capacitor of the present invention within the integrated circuit.

BRIEF DESCRIPTION OF THE DRAWINGS

The accompanying drawings, which form a material part of this disclosure, show the following:

FIG. 1 shows a schematic cross-sectional diagram of an integrated circuit of the prior art having formed therein a conventional planar capacitor.

FIG. 2 to FIG. 5 show a series of schematic cross-sectional diagrams illustrating the results of progressive process steps in forming within an integrated circuit the high areal capacitance planar capacitor of the preferred embodiment of the present invention.

DESCRIPTION OF THE PREFERRED EMBODIMENT

Figure 3:
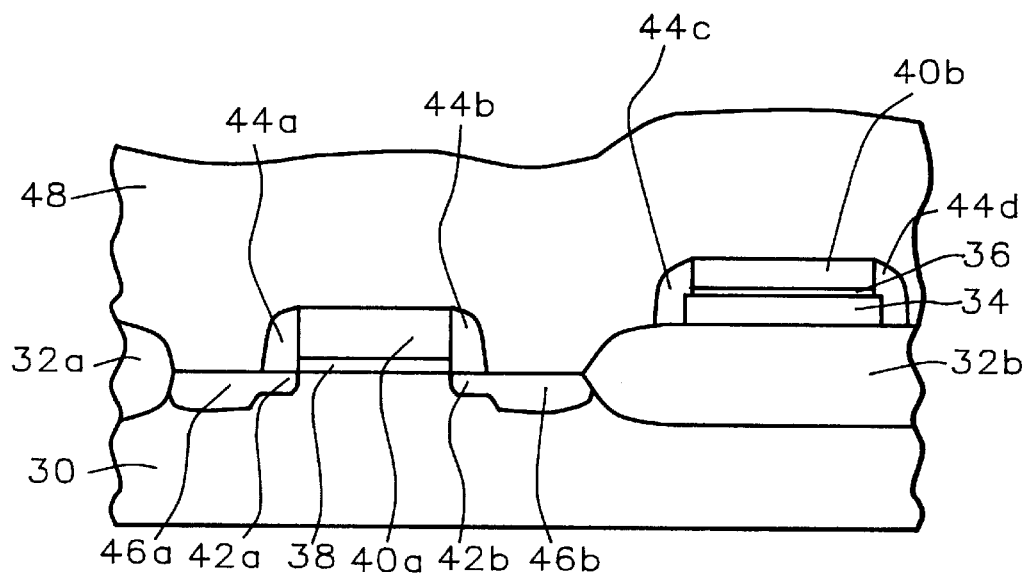

The present invention provides a method for forming a planar capacitor, and a planar capacitor formed through the method, which planar capacitor has an areal capacitance substantially higher than the areal capacitance of planar capacitors conventional in the art of integrated circuit manufacture. The high areal capacitance of the planar capacitor of the present invention is obtained through employing a second planar capacitor dielectric layer and a third planar capacitor electrode aligned upon a planar capacitor which is otherwise conventional to the art of integrated circuit manufacture. Due to the presence of the second planar capacitor dielectric layer and the third planar capacitor electrode, the planar capacitor of the present invention provides an areal capacitance approximately twice the areal capacitance of planar capacitors conventional to the art.

Although the high areal capacitance planar capacitor of the present invention is most likely to be employed as a planar capacitor within an analog integrated circuit, the high areal capacitance planar capacitor of the present invention may be employed within various types of integrated circuits. The high areal capacitance planar capacitor of the present invention may be employed within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Metal Oxide Semiconductor Field Effect Transistors (MOSFETs), integrated circuits having within their fabrications bipolar transistors and integrated circuits having within their fabrications Bipolar Complementary Metal Oxide Semiconductor (BiCMOS) transistors. The method of the present invention has broad applicability in forming within integrated circuits high areal capacitance planar capacitors.

Referring now to FIG. 2 to FIG. 5 there is shown a series of schematic cross-sectional diagrams illustrating the results of progressive stages in forming the high areal capacitance planar capacitor of the preferred embodiment of the present invention within an integrated circuit. Shown in FIG. 2 is a schematic cross-sectional diagram of the integrated circuit at its early stages of fabrication.

Shown in FIG. 2 is a semiconductor substrate 30 within and upon whose surface is formed isolation regions 32a and 32b. Semiconductor substrates upon which the present invention may be practiced may be formed with either dopant polarity, any dopant concentration and any crystallographic orientation. Typically, the semiconductor substrate 30 upon which is practiced the present invention is a N- or P-silicon semiconductor substrate having a (100) crystallographic orientation.

Methods by which isolation regions may be formed within and upon semiconductor substrates are known in the art. Such methods include but are not limited to methods whereby a portion of a semiconductor substrate exposed through an appropriate mask is oxidized to form isolation regions within and upon the semiconductor substrate, and methods whereby a separate blanket insulating layer is formed upon a semiconductor substrate and subsequently patterned to form isolation regions upon the semiconductor substrate. For the preferred embodiment of the present invention, the isolation regions 32a and 32b are preferably formed through a thermal oxidation process whereby portions of the semiconductor substrate 30 exposed through a suitable oxidation mask are consumed to form within and upon the semiconductor substrate 30 isolation regions 32a and 32b of silicon oxide.

Also illustrated in FIG. 2 is the presence of a first planar capacitor electrode 34 formed upon the surface of the isolation region 32b. Formed upon the surface of the first planar capacitor electrode 34 is a first planar capacitor dielectric layer 36. Both the first planar capacitor electrode 34 and the first planar capacitor dielectric layer 36 are components of the high areal capacitance planar capacitor of the present invention.

Several methods and materials may in general be employed in forming planar capacitor electrodes within integrated circuits. The methods and materials include but are not limited to thermally assisted evaporation methods, electron beam assisted evaporation methods, Physical Vapor Deposition (PVD) sputtering methods and Chemical Vapor Deposition (CVD) methods through which may be deposited blanket layers of conductive materials including but not limited to metals, metal alloys and highly doped polysilicon. The blanket layers of conductive materials may be subsequently patterned through methods conventional in the art to form planar capacitor electrodes.

For the preferred embodiment of the present invention, the first planar capacitor electrode 34 is preferably formed of a highly doped polysilicon layer patterned from a blanket highly doped polysilicon layer formed upon the semiconductor substrate 30 surface. The blanket highly doped polysilicon layer may be formed and doped through methods as are conventional in the art, including but not limited to Chemical Vapor Deposition (CVD) methods, Physical Vapor Deposition (PVD) sputtering methods, thermal diffusion methods and ion implantation methods. Preferably, the first planar capacitor electrode 34 has a thickness of from about 1000 to about 4000 angstroms, and the first planar capacitor electrode 34 has a resistance of no greater than about 50 ohms per square.

Analogously, planar capacitor dielectric layers may also be formed through several methods and materials as are conventional in the art of integrated circuit manufacture. Typically, although not exclusively, planar capacitor dielectric layers may be formed through patterning, through methods as are conventional in the art, of blanket dielectric layers formed within integrated circuits. Methods and materials through which blanket dielectric layers may be formed within integrated circuits include but are not limited to Chemical Vapor Deposition (CVD) methods, Plasma Enhanced Chemical Vapor Deposition (PECVD) methods and Physical Vapor Deposition (PVD) sputtering methods through which may be deposited dielectric materials including but not limited to silicon oxide dielectric materials, silicon nitride dielectric materials and silicon oxynitride dielectric materials. For the preferred embodiment of the present invention the first planar capacitor dielectric layer 36 is preferably formed of either a silicon oxide dielectric material, a silicon nitride dielectric material or a silicon oxynitride dielectric material. Preferably, the first planar capacitor dielectric layer 36 is from about 200 to about 800 angstroms thick.

Also shown in FIG. 2 is a gate dielectric layer 38 upon which resides a gate electrode 40a. Both the gate dielectric layer 38 and the gate electrode 40a reside upon the active semiconductor region of the semiconductor substrate 30. Both the gate dielectric layer 38 and the gate electrode 40a are components of a Metal Oxide Semiconductor Field Effect Transistor (MOSFET).

Methods and materials through which gate dielectric layers and gate electrodes may be formed upon active semiconductor regions of semiconductor substrates are known in the art. Gate dielectric layers may be formed through methods including but not limited to methods whereby the surface of the active semiconductor region of a semiconductor substrate is oxidized to form a blanket gate dielectric layer of silicon oxide upon the active semiconductor region of the semiconductor substrate, and methods whereby a blanket gate dielectric layer is independently deposited upon the active semiconductor region of the semiconductor substrate. Excess portions of blanket gate dielectric layers formed upon active semiconductor regions may be removed via etching, through processes conventional to the art, to form gate dielectric layers.

Gate electrodes are typically formed via patterning and etching, through methods as are conventional in the art, of blanket layers of gate electrode materials which are formed upon the surfaces of blanket gate dielectric layers. Typically, blanket layers of gate electrode materials are formed from highly conductive materials such as metals, metal alloys, highly doped polysilicon and polycides (highly doped polysilicon/metal silicide stacks).

For the preferred embodiment of the present invention, the gate dielectric layer 38 is preferably formed through patterning of a blanket gate dielectric layer formed through thermal oxidation of the active semiconductor region of semiconductor substrate 30 at a temperature of about 800 to about 1000 degrees centigrade to yield a blanket gate dielectric layer of silicon oxide at a typical thickness of about 40 to about 120 angstroms. For the preferred embodiment of the present invention, the gate electrode 40a is preferably formed by patterning and etching of either a blanket layer of highly doped polysilicon or a blanket tungsten silicide polycide (highly doped polysilicon/tungsten silicide stack) layer formed upon the blanket gate dielectric layer at a thickness of about 1500 to about 3000 angstroms. The highly doped polysilicon within either of the preceding two layers is preferably formed through a Chemical Vapor Deposition (CVD) method employing silane as the silicon source material, along with suitable dopant species. Once the blanket layer of highly doped polysilicon or the blanket tungsten silicide polycide layer has been patterned to yield the gate electrode 40a, the gate electrode 40a may be employed as an etch mask to pattern the gate dielectric layer 38 from the blanket gate dielectric layer. Although, as understood by a person skilled in the art, the first planar capacitor dielectric layer 36 and the gate dielectric layer 38 may under certain circumstances be patterned from the same blanket dielectric layer, such is not typically preferred when forming the high areal capacitance planar capacitor of the present invention. Typically, the differences in the preferred thicknesses of the first planar capacitor dielectric layer 36 and the gate dielectric layer 38 preclude easily forming those dielectric layers simultaneously from the same blanket dielectric layer.

Also shown in FIG. 2 is the presence of a second planar capacitor electrode 40b. The second planar capacitor electrode 40b is preferably patterned simultaneously from the same blanket layer of highly doped polysilicon or blanket tungsten silicide polycide (doped polysilicon/tungsten silicide stack) layer from which is patterned the gate electrode 40a. Analogously with the gate electrode 40a, the second planar capacitor electrode 40b is also preferably from about 1500 to about 3000 angstroms thick. The second planar capacitor electrode 40b also preferably has a resistance of no greater than about 50 ohms per square.

Finally, there is shown in FIG. 2 the presence of low dose ion implants 42a and 42b formed into the surface of the active region of the semiconductor substrate 30 at locations not occupied by the gate dielectric layer 38 and the gate electrode 40a. The low dose ion implants 42a and 42b assist in providing electric field gradients from the gate electrode 40a edges to subsequently formed source/drain electrodes of the completed Metal Oxide Semiconductor Field Effect Transistor (MOSFET) formed within and upon the semiconductor substrate 30, thus limiting the injection of charge carriers from the semiconductor substrate 30 into the gate dielectric layer 38 of the Metal Oxide Semiconductor Field Effect Transistor (MOSFET).

Methods and materials through which low dose ion implants may in general be formed within integrated circuits are known within the art of integrated circuit manufacture. Low dose ion implants are typically provided through ion implantation methods employing dopant species which are ionized and implanted at sufficient velocity and dose to form into a semiconductor substrate regions of conductivity sufficient for low dose ion implants. The polarity desired for the low dose ion implants will dictate the polarity of the dopant species. Arsenic dopant species, boron dopant species and phosphorus dopant species are common in the art. For the preferred embodiment of the present invention, the low dose ion implants 42a and 42b are preferably formed through implanting a suitable dopant species into the active region of the semiconductor substrate 30 at about 1E13 to about 1E14 ions per square centimeter dose and about 20 to about 80 keV ion implantation energy.

Referring now to FIG. 3, there is shown a schematic cross-sectional diagram illustrating the results of further processing of the integrated circuit whose structure is illustrated in FIG. 2. Shown in FIG. 3 is the presence of: (1) insulator spacers 44a and 44b formed adjoining a pair of opposite edges of the gate electrode 40a and the gate dielectric layer 38, and (2) insulator spacers 44c and 44d adjoining a pair of opposite edges of the first planar capacitor electrode 34, the first planar capacitor dielectric layer 36 and the second planar capacitor electrode 40b. Methods and materials through which insulator spacers may be formed within integrated circuits are known within the art of integrated circuit manufacture. Insulator spacers are typically, although not exclusively, formed through anisotropic Reactive Ion Etch (RIE) etching of blanket layers of insulator materials formed within integrated circuits. The blanket layers of insulator materials may be formed of insulator materials including but not limited to silicon oxide insulator materials, silicon nitride insulator materials and silicon oxynitride insulator materials deposited within integrated circuits through methods including but not limited to Chemical Vapor Deposition (CVD) methods, Plasma Enhanced Chemical Vapor Deposition (PECVD) methods and Physical Vapor Deposition (PVD) sputtering methods.

For the preferred embodiment of the present invention, the insulator spacers 44a, 44b, 44c and 44d may be formed of silicon oxide insulator materials, silicon nitride insulator materials or silicon oxynitride materials, as is common in the art.

Also shown in FIG. 3 is the presence of source/drain electrodes 46a and 46b formed, respectively, into the exposed surfaces of the semiconductor substrate 30 between the isolation region 32a and the insulator spacer 44a, and between the isolation region 32b and the insulator spacer 44b. Methods and materials through which source/drain electrodes may be formed within integrated circuits are conventional to the art of integrated circuit manufacture. Such methods and materials are also analogous to the methods and materials through which are formed low dose ion implants within integrated circuits. The polarity of the low dose ion implants, if present, will dictate the polarity of the source/drain electrodes. Arsenic dopant ions, boron dopant ions and phosphorus dopant ions are common in the art of forming source/drain electrodes. For the preferred embodiment of the present invention, the source/drain electrodes 46a and 46b are preferably formed through ion implanting into the semiconductor substrate 30 a suitable dopant species at an ion implantation dose of from about 1E15 to about 5E15 ions per square centimeter and an ion implantation energy of from about 20 to about 80 keV.

Finally, there is shown in FIG. 3 the presence of a conformal Pre-Metal Dielectric (PMD) layer 48. Conformal Pre-Metal Dielectric (PMD) layers may in general be formed through methods and materials analogous to methods and materials through which are formed other dielectric layers within integrated circuits. These methods and materials including but are not limited to Chemical Vapor Deposition (CVD) methods, Plasma Enhanced Chemical Vapor Deposition (PECVD) methods and Physical Vapor Deposition (PVD) sputtering methods through which are deposited dielectric materials including but not limited to silicon oxide dielectric materials, silicon nitride dielectric materials and silicon oxynitride dielectric materials. For the preferred embodiment of the present invention, the conformal Pre-Metal Dielectric (PMD) layer 48 is preferably formed of a Boro Phospho Silicate Glass (BPSG) dielectric layer deposited through Chemical Vapor Deposition (CVD) co-deposition method, as is common in the art. Other methods and materials may, however, alternatively be employed. Preferably, the thickness of the conformal Pre-Metal Dielectric (PMD) layer 48 is from about 5000 to about 10000 angstroms.

Figure 4:
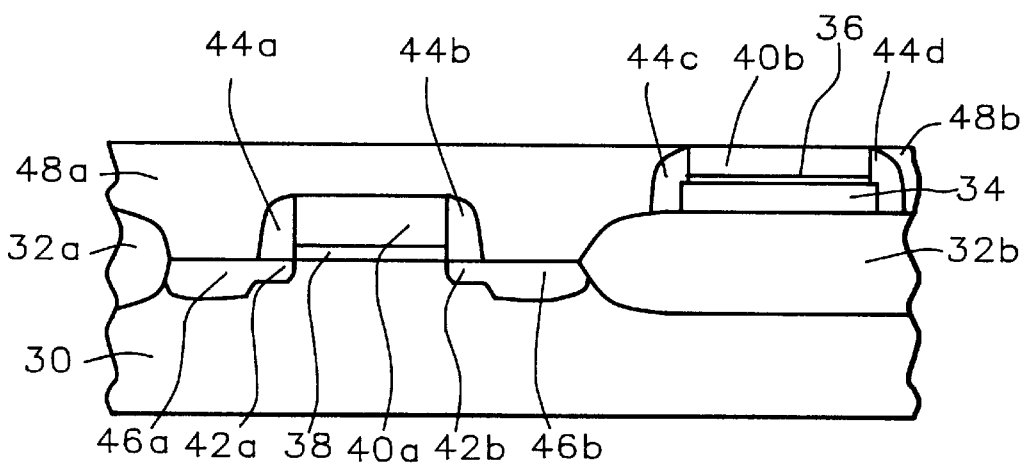

Referring now to FIG. 4 there is shown a schematic cross-sectional diagram illustrating the results of further processing of the integrated circuit whose structure is illustrated in FIG. 3. Shown in FIG. 4 is the results of planarizing the conformal Pre-Metal Dielectric (PMD) layer 48 illustrated in FIG. 3 to yield the planarized Pre-Metal Dielectric (PMD) layers 48a and 48b. Methods and materials through which conformal dielectric layers within integrated circuits may be planarized are known in the art. Conformal dielectric layers may be planarized through methods including but not limited to Reactive Ion Etch (RIE) etchback planarizing methods and Chemical Mechanical Polish (CMP) planarizing methods.

For the preferred embodiment of the present invention, the conformal Pre-Metal Dielectric (PMD) layer 48 is preferably planarized to yield the planarized Pre-Metal Dielectric (PMD) layers 48a and 48b through a Chemical Mechanical Polish (CMP) planarizing method, as is common in the art. Such Chemical Mechanical Polish (CMP) planarizing methods have been described, in general, by Cote in U.S. Pat. No. 5,262,354 and Allman in U.S. Pat. No. 5,312,512. The conformal Pre-Metal Dielectric (PMD) layer 48 is preferably planarized through the Chemical Mechanical Polish (CMP) planarizing method until the upper surface of the second planar capacitor electrode 40b is fully exposed.

Figure 5:
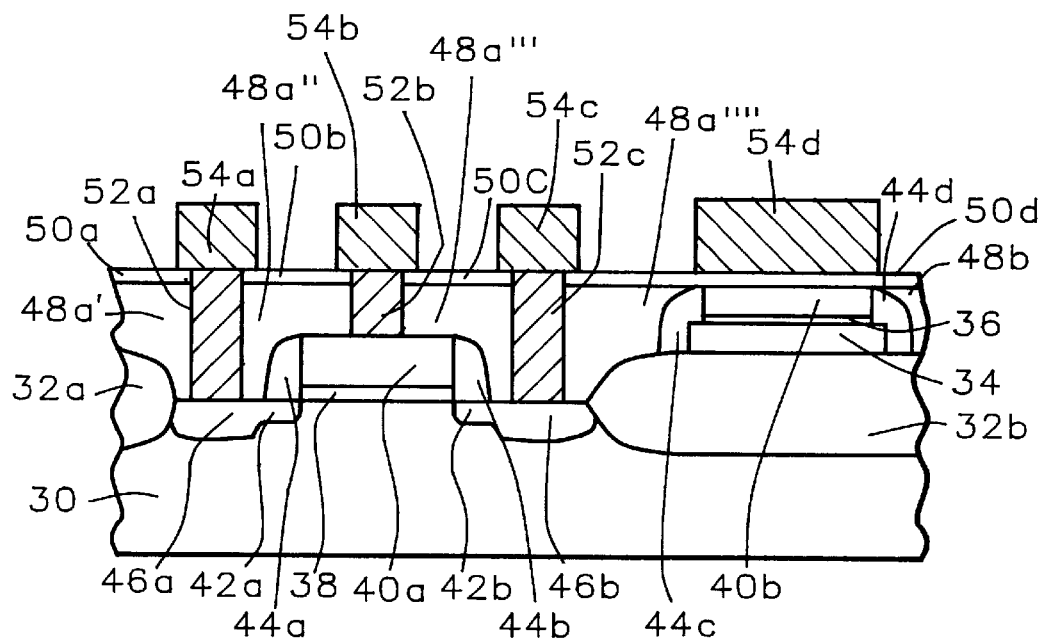

Referring now to FIG. 5, there is shown a schematic cross-sectional diagram illustrating the results of further processing of the integrated circuit whose structure is illustrated in FIG. 4. Shown in FIG. 5 is the presence of a series of patterned planar dielectric layers 50a, 50b and 50c corresponding with a series of patterned planarized Pre-Metal Dielectric (PMD) layers 48a', 48a'' and 48a''' which are formed through patterning of the planarized Pre-Metal Dielectric (PMD) layer 48. Also shown is the presence of a second planar capacitor dielectric layer 50d formed spanning the surfaces of a patterned planarized Pre-Metal Dielectric (PMD) layer 48a'''', the second planar capacitor electrode 40b and the planarized Pre-Metal Dielectric (PMD) layer 48b.

In order to form the series of patterned planar dielectric layers 50a, 50b and 50c, and the second planar capacitor dielectric layer 50d, there is first formed a blanket planar dielectric layer upon the surface of the planarized Pre-Metal Dielectric (PMD) layer 48a, the second planar capacitor electrode 40b and the planarized Pre-Metal Dielectric (PMD) layer 48b. Methods and materials through which is formed the blanket planar dielectric layer are analogous to the methods and materials through which is formed the blanket layer from which is formed the first planar capacitor dielectric layer 36. Preferably, the blanket planar dielectric layer is formed of a dielectric material chosen from the group of dielectric materials consisting of silicon oxide dielectric materials, silicon nitride dielectric materials and silicon oxynitride dielectric materials. Preferably, the blanket planar dielectric layer is preferably from about 200 to about 800 angstroms thick.

The blanket planar dielectric layer may then be patterned through photolithographic and etching methods as are conventional in the art to form the patterned planar dielectric layers 50a, 50b and 50c, and the second planar capacitor dielectric layer 50d. Within the same photolithographic and etching method, the planarized Pre-Metal Dielectric layer 48a is subsequently sequentially patterned to form the patterned planarized Pre-Metal Dielectric (PMD) layers 48a', 48a'', 48a''' and 48a'''', with apertures reaching the surfaces of the source/drain electrode 46a, the gate electrode 40a and the source/drain electrode 46b.

Also shown in FIG. 5 is the presence of conductive contact studs 52a, 52b and 52c, which are formed into the series of apertures formed by patterning the planarized Pre-Metal Dielectric (PMD) layer 48a to yield the patterned planarized Pre-Metal Dielectric (PMD) layers 48a', 48a'', 48a''' and 48a''''.

Methods and materials through which conductive contact studs may be formed within patterned planarized dielectric layers within integrated circuits are known within the art of integrated circuit manufacture. Conductive contact studs may be formed into apertures between patterned planarized dielectric layers through methods including but not limited to thermally assisted evaporation methods, electron beam assisted evaporation methods, Physical Vapor Deposition (PVD) sputtering methods and Chemical Vapor Deposition (CVD) methods. Conductive contact studs may be formed of conductive materials including but not limited to metals, metal alloys and highly doped polysilicon.

For the preferred embodiment of the present invention, the conductive contact studs 52a, 52b and 52c are preferably formed of tungsten metal formed into the apertures between the patterned planarized Pre-Metal Dielectric (PMD) layers 48a', 48a'', 48a''' and 48a'''' through a Chemical Vapor Deposition (CVD) method, as is common in the art. The conductive contact studs 52a, 52b and 52c make contact, respectively, with the source/drain electrode 46a, the gate electrode 40a and the source/drain electrode 46b. The conductive contact studs 52a, 52b and 52c are preferably formed of a sufficient height to reach the upper surfaces of the patterned planar dielectric layers 50a, 50b and 50c, and the second planar capacitor dielectric layer 50d.

Finally, there is shown in FIG. 5 the presence of patterned first conductor layers 54a, 54b and 54c, and a third planar capacitor electrode 54d. Methods and materials through which may be formed patterned conductor layers within integrated circuits are known within the art of integrated circuit manufacture. Patterned conductor layers are typically formed through patterning and etching through methods as are conventional in the art of blanket conductor layers. Blanket conductor layers may be formed within integrated circuits from conductor materials including but not limited to metals, metal alloys and highly doped polysilicon, formed within integrated circuits through methods including but not limited to thermal evaporation methods, electron beam assisted evaporation methods, Physical Vapor Deposition (PVD) sputtering methods and Chemical Vapor Deposition (CVD) methods. For the preferred embodiment of the present invention, the patterned first conductor layers 54a, 54b and 54c, and the third planar capacitor electrode 54d, are preferably simultaneously patterned from a single blanket conductor layer formed of an aluminum containing alloy. Preferably, the thickness of the patterned first conductor layers 54a, 54b and 54c, and the third planar capacitor electrode 54d is from about 3000 to about 8000 angstroms each.

Upon forming the patterned first conductor layers 54a, 54b and 54c, and the third planar capacitor electrode 54d, there is formed an integrated circuit which has formed therein the high areal capacitance planar capacitor of the preferred embodiment of the present invention. The high areal capacitance planar capacitor is comprised of the first planar capacitor electrode 34, the first planar capacitor dielectric layer 36, the second planar capacitor electrode 40b, the second planar capacitor dielectric layer 50d and the third planar capacitor electrode 54d. The high areal capacitance planar capacitor of the present invention has an areal capacitance approximately double that of planar capacitors conventional in the art, due to the presence of an additional planar capacitor dielectric layer and an additional planar capacitor electrode, in comparison with planar capacitors conventional to the art.

In addition, many, if not all of the dielectric layers and electrodes formed within the high areal capacitance planar capacitor of the present invention may be formed concurrently with dielectric layers and conductor layers which are employed in forming other structures within the integrated circuit within which is formed the high areal capacitance planar capacitor of the present invention. Thus, the high areal capacitance planar capacitor of the present invention may be formed within an integrated circuit with limited, if any, additional masking steps.

Figure 6:
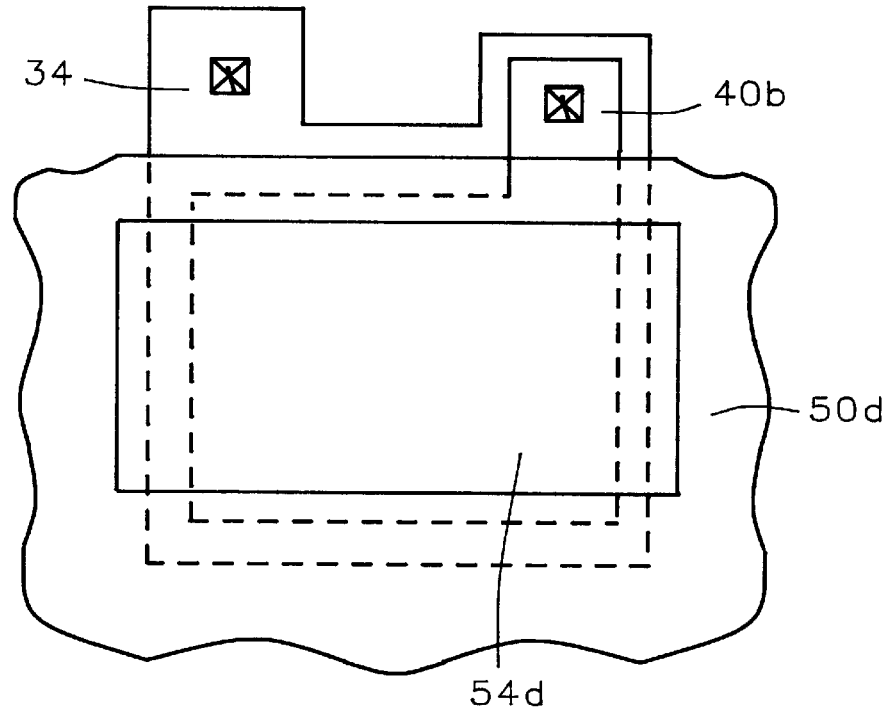
FIG. 6 shows a schematic plan-view diagram of the high areal capacitance planar capacitor of the preferred embodiment of the present invention.

Referring now to FIG. 6 there is shown a schematic plan-view diagram of the high areal capacitance planar capacitor of the present invention. Absent from FIG. 6 are: (1) portions of the patterned planarized Pre-Metal Dielectric (PMD) layer 48a'''', (2) portions of the planarized Pre-Metal Dielectric (PMD) layer 48b, and (3) portions of the insulator spacers 44c and 44d, which portions adjoin the high areal capacitance planar capacitor. Shown in FIG. 6 is the presence of the third planar capacitor electrode 54d, immediately below which resides the second planar capacitor dielectric layer 50d. Directly beneath the second planar capacitor dielectric layer 50d resides the second planar capacitor electrode 40b and beneath the second planar capacitor electrode 40b resides the first planar capacitor electrode 34. The outline of the first planar capacitor dielectric layer 36 is coincident with the second planar capacitor electrode 40b. Thus, the first planar capacitor dielectric layer 36 is not shown in FIG. 6.

As is understood by a person skilled in the art, the preferred embodiment of the high areal capacitance planar capacitor of the present invention is illustrative of the high areal capacitance planar capacitor of the present invention rather than limiting of the high areal capacitance planar capacitor of the present invention. Revisions may be made to methods, materials structures and dimensions through which is formed the high areal capacitance planar capacitor of the present invention while still forming a high areal capacitance planar capacitor within the spirit and scope of the present invention.

What is claimed is:

1. A method for forming a planar capacitor comprising:

providing a semiconductor substrate;

forming over the semiconductor substrate a first planar capacitor electrode;

forming upon the first planar capacitor electrode a first planar capacitor dielectric layer;

forming upon the first planar capacitor dielectric layer a second planar capacitor electrode;

forming surrounding the second planar capacitor electrode a Pre-Metal Dielectric (PMD) layer;

planarizing the Pre-Metal Dielectric (PMD) layer to expose completely the upper surface of the second planar capacitor electrode;

forming upon the upper surface of the second planar capacitor electrode a second planar capacitor dielectric layer; and forming upon the second planar capacitor dielectric layer a third planar capacitor electrode.

2. The method of claim 1 wherein the first planar capacitor electrode is formed of doped polysilicon at a thickness of from about 1000 to about 4000 angstroms.

3. The method of claim 1 wherein:

the first planar capacitor dielectric layer is formed from a dielectric material chosen from the group of dielectric materials consisting of silicon oxide dielectric materials, silicon nitride dielectric materials and silicon oxynitride dielectric materials; and, the first planar capacitor dielectric layer is from about 200 to about 800 angstroms thick.

4. The method of claim 1 wherein:

the second planar capacitor electrode is formed from a conductive material chosen from the group of conductive materials consisting of doped polysilicon and tungsten silicide polycide (doped polysilicon/tungsten silicide stack) conductive materials; and the second planar capacitor electrode has a thickness of from about 1500 to about 3000 angstroms.

5. The method of claim 1 wherein:

the second planar capacitor dielectric layer is formed from a dielectric material chosen from the group of dielectric materials consisting of silicon oxide dielectric materials, silicon nitride dielectric materials and silicon oxynitride dielectric materials; and the second planar capacitor dielectric layer is from about 200 to about 800 angstroms thick.

6. The method of claim 1 wherein the third planar capacitor electrode is formed from a metal layer at a thickness of from about 3000 to about 8000 angstroms.

7. The method of claim 6 wherein the metal layer is patterned from a conductor metal layer within an integrated circuit.

8. A method for forming a planar capacitor within an integrated circuit comprising:

providing a semiconductor substrate;

forming upon the semiconductor substrate a minimum of one transistor;

forming over the semiconductor substrate a first planar capacitor electrode;

forming upon the first planar capacitor electrode a first planar capacitor dielectric layer;

forming upon the first planar capacitor dielectric layer a second planar capacitor electrode;

forming surrounding the second planar capacitor electrode a Pre-Metal Dielectric (PMD) layer;

planarizing the Pre-Metal Dielectric (PMD) layer to expose completely the upper surface of the second planar capacitor electrode;

forming upon the upper surface of the second planar capacitor electrode a second planar capacitor dielectric layer; and forming upon the second planar capacitor dielectric layer a third planar capacitor electrode.

9. The method of claim 8 wherein the transistor is a Metal Oxide Semiconductor Field Effect Transistor (MOSFET).

10. The method of claim 8 wherein the first planar capacitor electrode is formed of doped polysilicon at a thickness of from about 1000 to about 4000 angstroms.

11. The method of claim 8 wherein:

the first planar capacitor dielectric layer is formed from a dielectric material chosen from the group of dielectric materials consisting of silicon oxide dielectric materials, silicon nitride dielectric materials and silicon oxynitride dielectric materials; and the first planar capacitor dielectric layer is from about 200 to about 800 angstroms thick.

12. The method of claim 8 wherein:

the second planar capacitor electrode is formed from a conductive material chosen from the group of conductive materials consisting of doped polysilicon and tungsten silicide polycide (doped polysilicon/tungsten silicide stack) conductive materials; and the second planar capacitor electrode is from about 1500 to about 3000 angstroms thick.

13. The method of claim 8 wherein:

the second planar capacitor dielectric layer is formed from a dielectric material chosen from the group of dielectric materials consisting of silicon oxide dielectric materials, silicon nitride dielectric materials and silicon oxynitride dielectric materials; and the second planar capacitor dielectric layer is from about 200 to about 800 angstroms thick.

14. The method of claim 8 wherein the third planar capacitor electrode is formed from a metal layer at a thickness of from about 3000 to about 8000 angstroms.

15. The method of claim 14 wherein the metal layer is patterned from a conductor metal layer within an integrated circuit.

* * * * *